(12) United States Patent
Shimura et al.

(10) Patent No.: US 8,553,467 B2
(45) Date of Patent: Oct. 8, 2013

(54) NONVOLATILE SEMICONDUCTOR MEMORY DEVICE

(75) Inventors: Yasuhiro Shimura, Yokohama (JP); Mitsuhiro Noguchi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 113 days.

(21) Appl. No.: 13/226,881

(22) Filed: Sep. 7, 2011

(65) Prior Publication Data
US 2012/0195129 A1 Aug. 2, 2012

(30) Foreign Application Priority Data
Jan. 28, 2011 (JP) .................................. 2011-015913

(51) Int. Cl.
*G11C 11/00* (2006.01)
(52) U.S. Cl.
USPC ............. 365/185.29; 365/185.11; 365/185.17
(58) Field of Classification Search
USPC ............. 365/185.29, 185.11, 185.17, 185.18, 365/185.33, 185.23, 185.22, 185.24, 185.02
See application file for complete search history.

(56) References Cited

U.S. PATENT DOCUMENTS

| 7,652,928 | B2 | 1/2010 | Yanagidaira et al. |
| 7,949,910 | B2 | 5/2011 | Kanno et al. |
| 7,958,411 | B2 | 6/2011 | Kanno et al. |
| 8,015,347 | B2 | 9/2011 | Kitsunai et al. |
| 2003/0123296 | A1 * | 7/2003 | Hirano ...................... 365/185.29 |
| 2010/0223424 | A1 | 9/2010 | Kitsunai et al. |
| 2011/0063917 | A1 * | 3/2011 | Shiino et al. ............. 365/185.17 |

FOREIGN PATENT DOCUMENTS

| JP | 2008-27511 | 2/2008 |
| JP | 2008-165960 | 7/2008 |
| JP | 2009-70379 | 4/2009 |
| JP | 2009-163329 | 7/2009 |
| JP | 2009-265912 | 11/2009 |
| JP | 2010-3401 | 1/2010 |
| JP | 2010-67284 | 3/2010 |
| JP | 2010-108522 | 5/2010 |

OTHER PUBLICATIONS

U.S. Appl. No. 13/107,623, filed May 13, 2011, Shinichi Kanno, et al.

* cited by examiner

*Primary Examiner* — Dang Nguyen
(74) *Attorney, Agent, or Firm* — Oblon, Spivak, McClelland, Maier & Neustadt, L.L.P.

(57) ABSTRACT

A control circuit controls various kinds of operations on the memory cell array. The control circuit executes a pre-erase stress application operation in which, when an erase operation on one of the memory cells is executed, prior to the erase operation, a first voltage belonging in a certain voltage range is applied to the control gate while a second voltage having a value smaller than a value of the first voltage is applied to the channel region, whereby a stress is applied to the memory cell due to a potential difference between the first voltage and the second voltage.

17 Claims, 16 Drawing Sheets

(Pre-Erase Stress Application Operation)

EVEN (First Operation)

ODD (Second Operation)

US 8,553,467 B2

NONVOLATILE SEMICONDUCTOR MEMORY DEVICE

CROSS REFERENCE TO RELATED APPLICATIONS

This application is based on and claims the benefit of priority from prior Japanese Patent Application No. 2011-15913, filed on Jan. 28, 2011, the entire contents of which are incorporated herein by reference.

FIELD

This invention relates to a nonvolatile semiconductor memory device.

BACKGROUND

NAND-type flash memory is a widely known example of a semiconductor memory device capable of storing data in a nonvolatile manner and realizing large capacity data storage. A cell array in a NAND-type flash memory is configured having NAND cell units arranged therein, each of the NAND cell units having a plurality of memory cells connected in series. The two ends of each NAND cell unit are connected via a select gate transistor to a bit line and a source line, respectively. Control gates of the memory cells in the NAND cell unit are each connected to a different word line.

A memory cell in a NAND-type flash memory includes a charge storage film (a floating gate configured from a conductive film of, for example, polysilicon or the like) formed on a gate insulating film, and a control gate formed on this charge storage film via an inter-gate insulating film. The NAND-type flash memory controls a threshold voltage of the memory cell by controlling an amount of charge stored in the charge storage film, and stores data based on a difference in this threshold voltage.

As further progress in miniaturization is made and research and development of multi-level data storage systems is advanced, there occurs a problem in the above-described kind of NAND-type flash memory, namely, spreading of a width of a threshold voltage distribution due to a write operation/erase operation being repeated on the memory cell. On the other hand, maintaining and improving data retention characteristics is also an important issue. Accordingly, it is desired to suppress spreading of the width of the threshold voltage distribution due to a write operation/erase operation being repeated on the memory cell, while at the same time maintaining good data retention characteristics.

DETAILED DESCRIPTION

A nonvolatile semiconductor memory device in embodiments described below comprises a memory cell array and a control circuit. The memory cell array includes a plurality of memory strings arranged therein, each of the memory strings includes memory cells connected in series, each of the memory cells comprising a charge storage film formed on a channel region via a gate insulating film, and a control gate formed on the charge storage film via an insulating film. The control circuit controls is configured to enable execution of a pre-erase stress application operation prior to the erase operation. The pre-erase stress application operation applies a first voltage to the control gate, while applying a second voltage having a value smaller than a value of the first voltage to the channel region, whereby a stress is applied to the memory cell due to a potential difference between the first voltage and the second voltage causing a charge trapped in a region other than the charge storage film to be discharged.

Next, various embodiments of the present invention are described in detail with reference to the drawings.

First Embodiment

First, a semiconductor memory device according to a first embodiment of the present invention is described with reference to FIG. 1 and so on.

[Overall Configuration of System]

Figure 1:
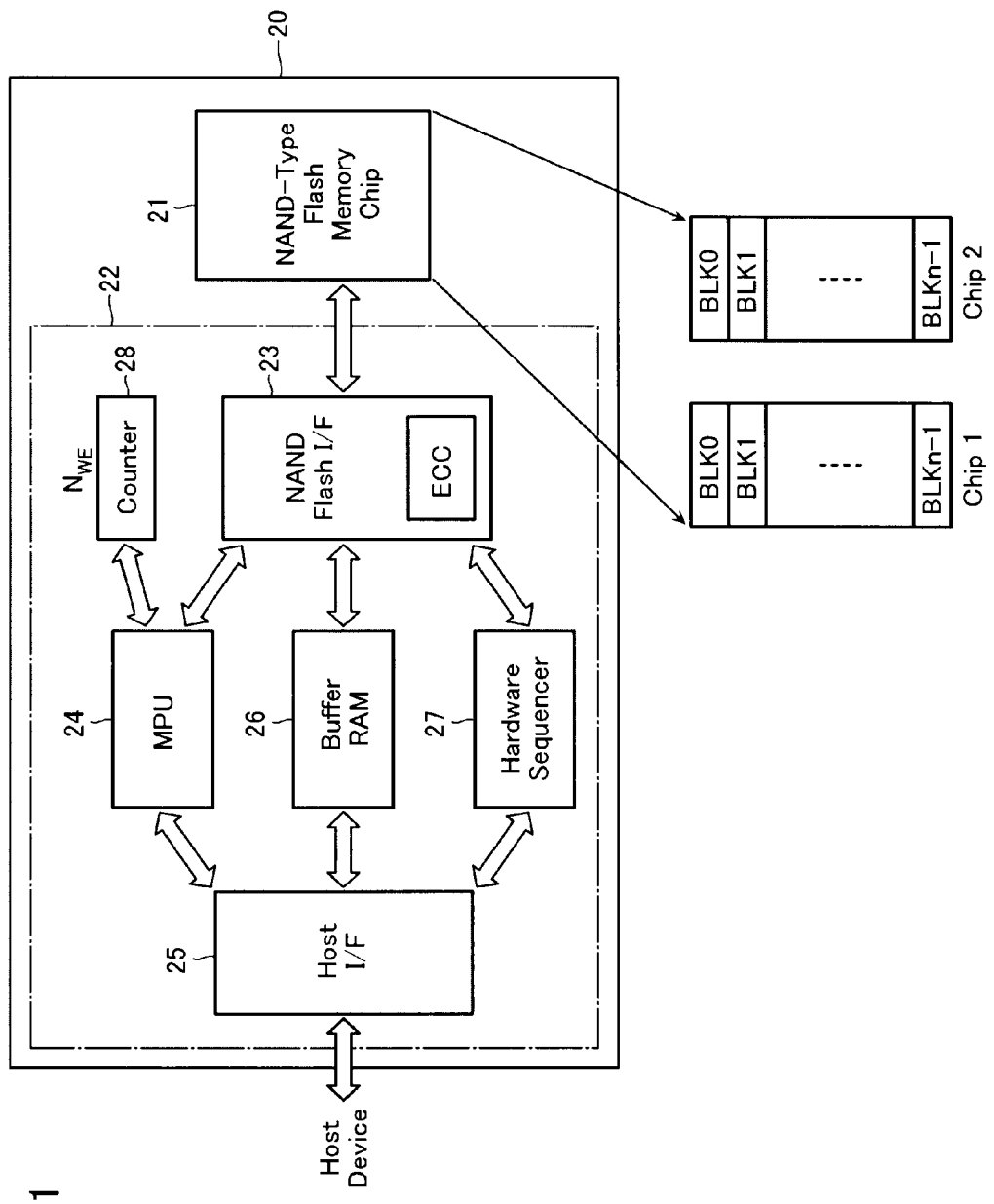
FIG. 1 is a block diagram showing an overall configuration of a memory card 20 which is a nonvolatile semiconductor memory device according to a first embodiment.

FIG. 1 is a block diagram showing an overall configuration of a memory card 20 as is a nonvolatile semiconductor memory device according to the first embodiment. This memory card 20 configures a module including a NAND-type flash memory chip 21 and a memory controller 22 that controls read/write in the NAND-type flash memory chip 21. The flash memory chip 21 may include a plurality of memory chips.

FIG. 1 shows two memory chips chip 1, chip 2. Even in this case, the memory chips are controlled by one memory controller 22. The memory controller 22 is a one-chip controller including: a NAND flash interface 23 for performing data transfer between the memory chip 21 and the memory controller 22; an MPU 24 for performing operational control of the memory card overall, as well as data transfer control; a host interface 25 for performing data transfer between a host device and the memory controller 22; a buffer RAM 26 for temporarily retaining read/write data, and so on; and a hardware sequencer 27 employed in sequence control, and so on, of read/write of firmware (FW) in the NAND-type flash memory chip 21. In addition, the memory controller 22 comprises a counter 28 for counting the number of times that a write operation or erase operation on the NAND-type flash memory chip 21 is performed.

When a power supply is turned on in the memory card 20, an initializing operation (power-on initial set-up operation) for automatically reading firmware (control program) stored in the flash memory chip 21 is performed, and this firmware is transferred to a data register (buffer RAM) 26. This read control is here performed by the hardware sequencer 27.

Due to the firmware loaded into the buffer RAM 26, the MPU 24 creates various kinds of tables in the buffer RAM 26, receives commands from the host device to access the flash memory chip 21, and performs data transfer control. Note that the NAND flash interface 23 comprises an ECC circuit for performing error correction of read data.

Figure 2:
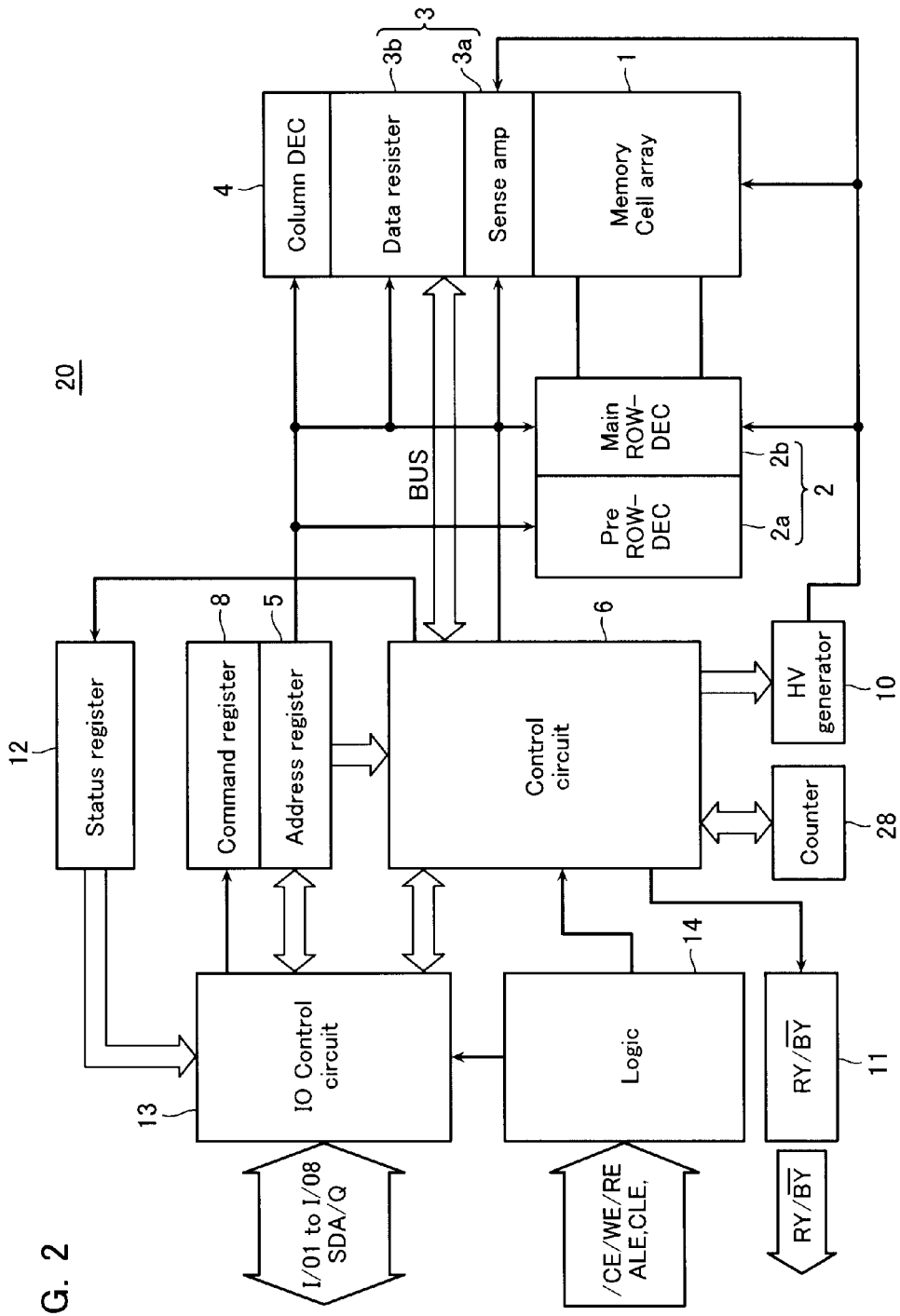
FIG. 2 is a functional block diagram of the memory card 20 of FIG. 1, in which a memory chip 21 and a controller 22 are viewed as a harmonious whole.

Note that it is not essential to this system that the flash memory chip 21 and the memory controller 22 are separate chips. FIG. 2 shows a functional block configuration of the memory card 20 of FIG. 1, where logic control of the memory chip 21 and the controller 22 are viewed as a harmonious combination. Moreover, FIG. 3 shows a cell array configuration of a memory core portion thereof.

[Configuration of Memory Cell Array 1]

Figure 3:
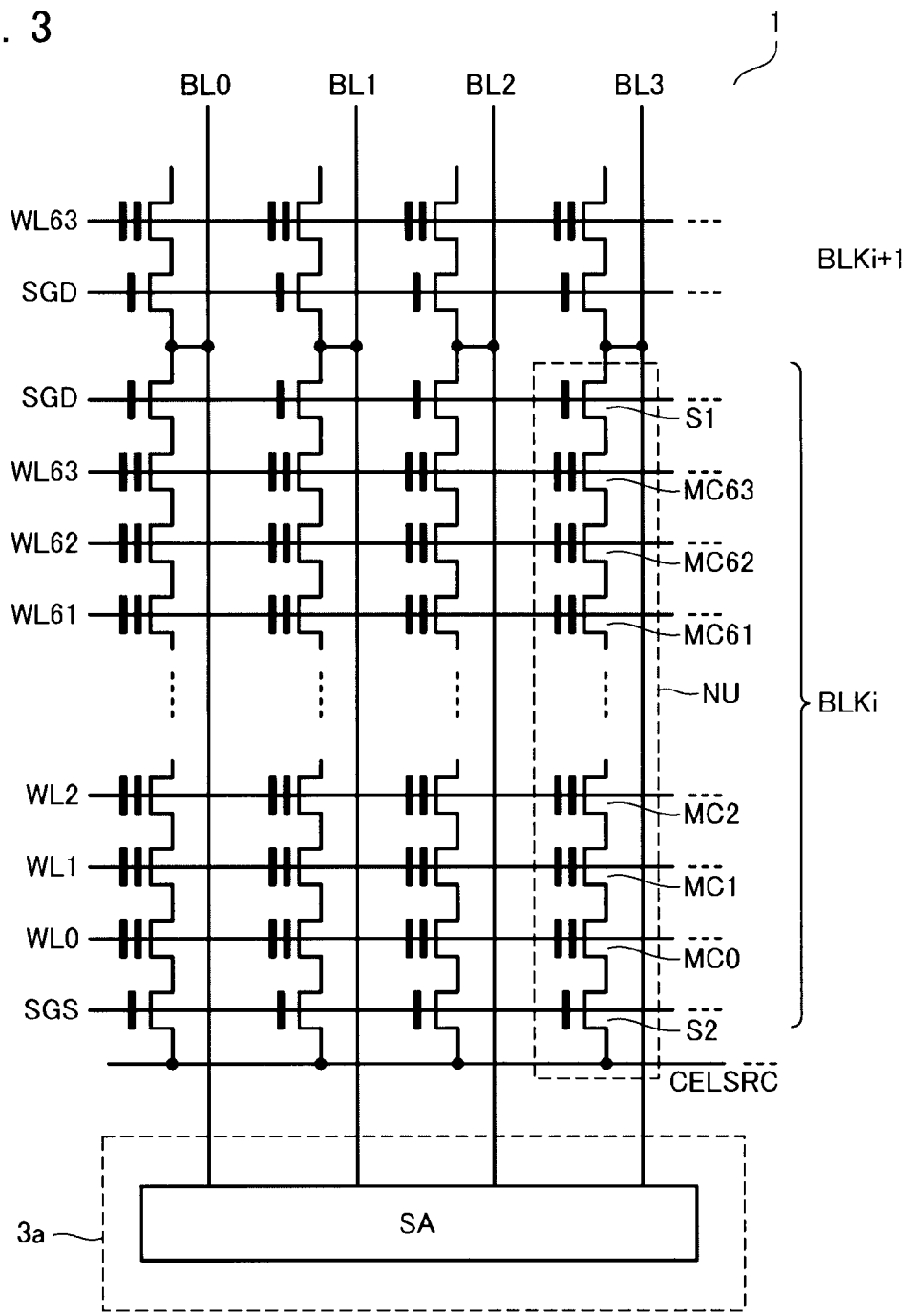
FIG. 3 is a circuit diagram showing a specific configuration of a memory cell array 1.

As shown in FIG. 3, a memory cell array 1 is configured as an arrangement of NAND cell units NU, each of the NAND cell units NU including a memory string MS configured having a plurality of electrically rewritable nonvolatile memory cells (64 in the example of FIG. 3) MC0-MC64 connected in series, and select gate transistors S1, S2 connected to the two ends of this memory string MS. A plurality of the NAND cell units NU share word lines WL to form one block BLK.

One block BLK forms a minimum unit in a data erase operation. Moreover, in the case where two bits of data are stored in one memory cell MC (two bits per cell), the memory cells MC formed along one word line WL allow two pages of data to be stored (upper page UPPER, lower page LOWER). When the number of word lines WL in one block BLK in one memory cell array 1 is, for example, 64, then the number of pages in one block is 64×2=128.

As shown in FIG. 3, the NAND cell unit NU has one end connected via the select gate transistor S1 to a bit line BL, and the other end connected via the select gate transistor S2 to a common source line CELSRC. The select gate transistors S1, S2 have their gates connected to, respectively, select gate lines SGD, SGS. Moreover, the memory cells MC0-MC63 have their gates connected to, respectively, word lines WL0-WL63.

Disposed at one ends of the bit lines BL is a sense amplifier 3a for use in read and write of cell data. Disposed at one ends of the word lines WL is a row decoder (not shown in FIG. 3) for performing select drive of the word lines and select gate lines.

As shown in FIG. 2, commands, addresses, and data are inputted via an input/output control circuit 13. External control signals such as a chip enable signal /CE, a write enable signal /WE, a read enable signal /RE are inputted to a logic circuit 14, to be employed for timing control. Commands are decoded by a command register 8.

A control circuit 6 performs transfer control of data and sequence control of write/erase/read of data. A status register 11 outputs a Ready/Busy state of the memory card 20 to a Ready/Busy terminal. Apart from this the status register 11, there is provided a status register 12 which informs a host of a state (Pass/Fail, Ready/Busy, etc.) of the memory card 20 via an I/O port.

Addresses are transferred via an address register 5 to the row decoder 2 (pre row decoder 2a and main row decoder 2b) or a column decoder 4. Write data is loaded via the input/output control circuit 13, the control circuit 6, and a data bus BUS into the sense amplifier circuit 3 (sense amplifier 3a and data register 3b) to be outputted to external.

A high voltage generating circuit 10 is provided to generate a high voltage required according to each operation mode. The high voltage generating circuit 10 generates a certain high voltage based on an instruction given from the control circuit 6.

[Configuration of Memory Cell MC and Select Gates S1, S2]

Figure 4:
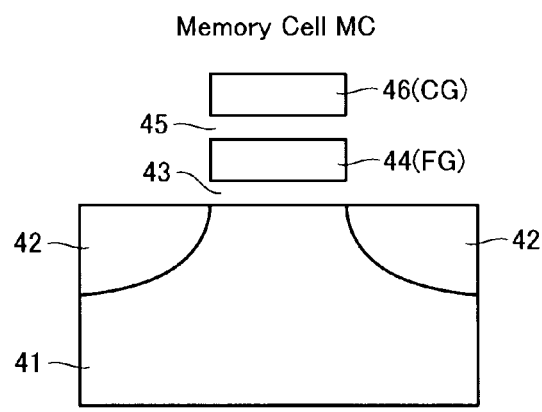
FIG. 4 is a cross-sectional view showing a configuration of a memory cell MC.
Figure 5:
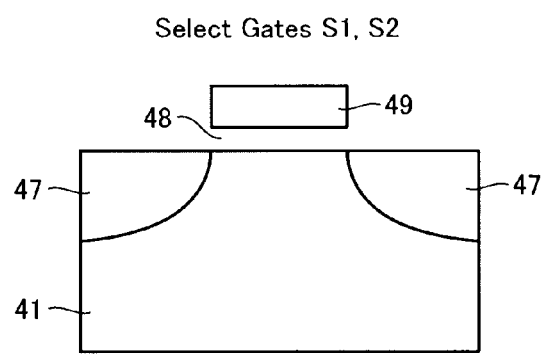
FIG. 5 is a cross-sectional view showing a configuration of select transistors S1, S2.

FIGS. 4 and 5 show cross-sectional structures of the memory cell MC and the select gates S1, S2, respectively. Formed in a substrate 41 are n-type diffusion layers 42 functioning as a source and a drain of a MOSFET configuring the memory cell MC. A region sandwiched by the two n-type diffusion layers 42 functions as a channel region. In addition, a floating gate (FG) 44 is formed (in the channel region) on the substrate 41, via a gate insulating film 43. The floating gate 44 is configured capable of retaining a charge therein, and a threshold voltage of the memory cell MC is determined by an amount of that charge. A control gate (CG) 46 is formed on this floating gate 44 via an inter-gate insulating film 45.

The select gates S1, S2 comprise a substrate 41, and n-type diffusion layers 47 formed in this substrate 41 and acting as a source and a drain. A control gate 49 is formed on the substrate 41 via a gate insulating film 48.

[NAND Cell Unit NU]

Figure 6:
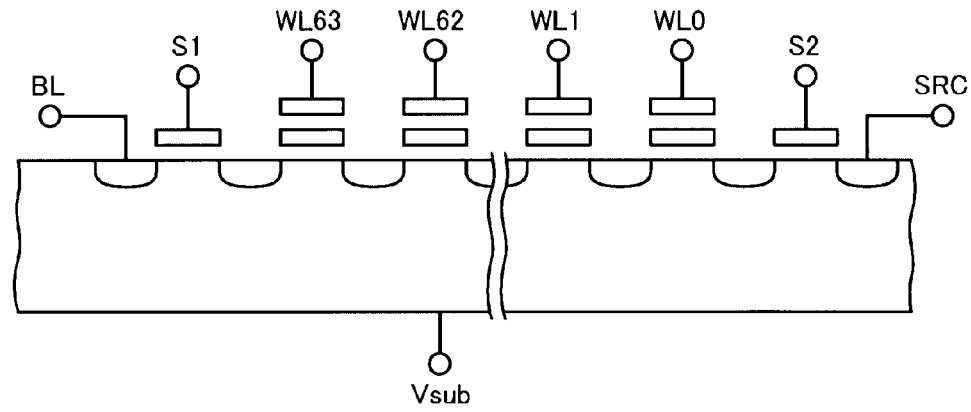
FIG. 6 is a cross-sectional view showing a configuration of a NAND cell unit NU.

FIG. 6 shows a cross-section of one NAND cell unit NU in the memory cell array 1. In this example, one NAND cell unit NU is configured having 64 memory cells MC with the configuration shown in FIG. 4 connected in series. A first select gate S1 and a second select gate S2 with the configuration shown in FIG. 5 are provided on, respectively, a drain side and a source side of the NAND cell unit NU.

[Multi-Level Storage in NAND-Type Flash Memory]

Figure 7:
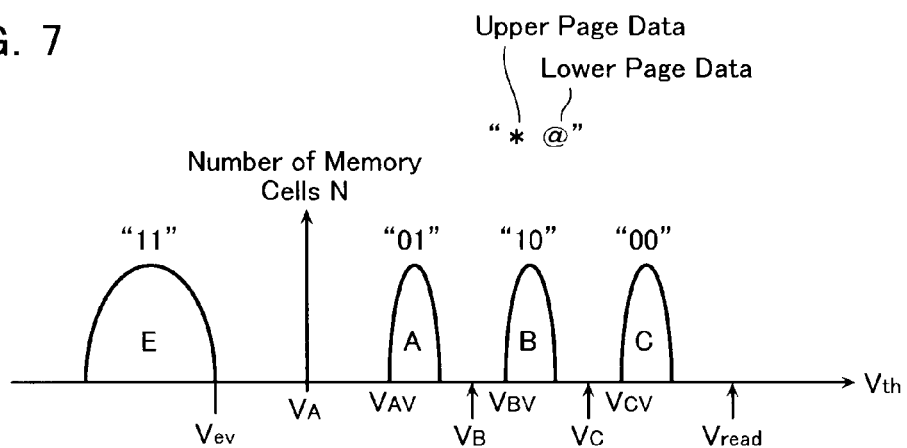
FIG. 7 is a state diagram of a threshold voltage distribution in the case where two bits of information are stored in one memory cell (relationship diagram of threshold voltage Vth and number of cells).
Figure 8:
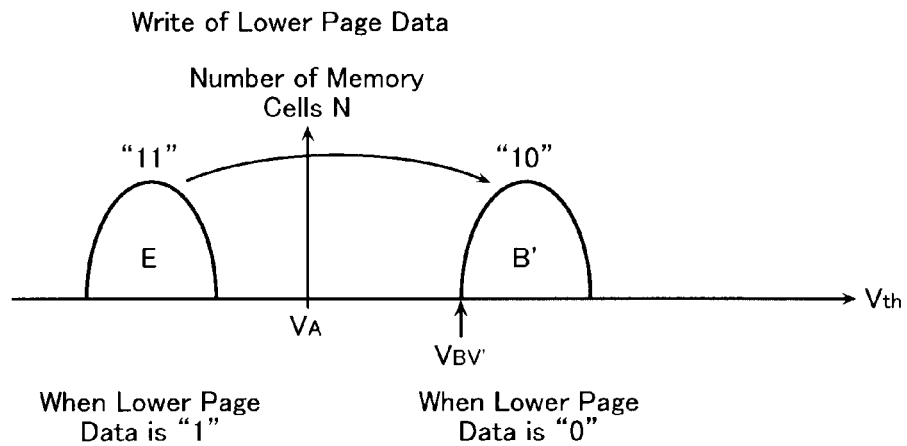
FIG. 8 shows an outline of a write operation (lower page write) in the case where two bits of information are stored in one memory cell.

Next, a multi-level storage system in the NAND-type flash memory configured as above is described with reference to FIGS. 7-9. As shown in FIG. 7, in the NAND-type flash memory, a value of the threshold voltage in one memory cell is controlled to be included in for kinds of threshold voltage distributions to enable two bits of data to be stored in one memory cell. Hereinafter, description proceeds taking a four-level data storage system as an example. Even if a multi-level data storage system of other than four-level data, that is, of eight-level data (three bits) or more is adopted, only the number of threshold voltage distributions differs, and the fundamental principle is the same.

In order to store two bits of information, four kinds of threshold voltage distributions (E, A-C) corresponding to four kinds (patterns) of data, namely, "11", "01", "10", "00", are provided to perform write and read of information. That is, each of four kinds of bit information (11, 01, 10, 00) are allocated one to each of four kinds of threshold voltage distributions (A-C). Two sub pages are formed corresponding to this two-bit data, that is, the upper page UPPER and the lower page LOWER.

During a read operation of these four kinds of data, a read voltage is applied to a selected word line WL connected to the memory cell MC to detect conduction/non-conduction of the memory cell MC. A voltage value of the read voltage applied to the selected word line WL can be set to voltages VA, VB, VC (three kinds) between an upper limit and a lower limit of each of the threshold voltage distributions as shown in FIG. 7, corresponding to the four kinds of threshold voltage distributions of the memory cell. The read voltage VA is the lowest voltage, and voltage values increase in order of VB, VC. Note that a voltage Vread applied to an unselected memory cell MC during the read operation is set to a voltage larger than an upper limit value of the threshold voltage distribution C allocated to data "10". That is, the voltage Vread is a voltage applied to an unselected memory cell in the NAND cell unit when read of data is performed, and renders said unselected memory cell conductive regardless of retained data of the unselected memory cell.

In FIG. 7, voltages VAV, VBV, VCV indicate verify voltages which are applied, in the case of performing write to each of the threshold voltage distributions, to confirm whether the write has been completed.

Furthermore, Vev is an erase verify voltage applied to a memory cell, in the case of erasing data in the memory cell, to confirm whether erase has been completed or not, determined in consideration of effects of interference of an adjacent memory cell. A magnitude relation of each of the above-mentioned voltages is Vev<VA<VAV<VB<VBV<VC<VCV<Vread.

Note that, as previously mentioned, the erase verify voltage Vev is a negative value. However, the voltage actually applied to a control gate of the memory cell MC in an erase verify operation is zero or a positive value, not a negative value. That is, in an actual erase verify operation, a back gate of the memory cell MC is applied with a positive voltage, and the control gate of the memory cell MC is applied with a voltage of zero or a positive value smaller than that of the back gate voltage. In other words, the erase verify voltage Vev is a voltage that has, equivalently, a negative value.

The threshold voltage distribution E of a memory cell after block erase has an upper limit value which is a negative value, and is allocated with data "11". Moreover, memory cells having a write state of data "01", "10", "00" have, positive threshold voltage distributions A, B, C (lower limit values of A, B, C are also positive values) respectively. The threshold voltage distribution A of data "01" has a lowest voltage value, the threshold voltage distribution C of data "00" has a highest voltage value, and the threshold voltage distribution B of data "10" has an intermediate voltage value between those of data "01" and data "00". Note that the threshold voltage distributions shown in FIG. 7 are purely an example, and that the present invention is not limited to these threshold voltage distributions. For example, description has proceeded on the assumption that the threshold voltage distributions A, B, C in FIG. 7 are all positive threshold voltage distributions. However, the case where the threshold voltage distribution A is a negative voltage distribution, and the threshold voltage distributions B, C are positive voltage distributions is also included in the scope of the present invention. Moreover, the threshold voltage distribution E may also be a positive voltage distribution.

Two-bit data of one memory cell is configured from lower page data and upper page data, and the lower page data and upper page data are written to the memory cell by separate write operations, in other words, by two times of write operations. When the notation data "*@" appears, * indicates upper page data and @ indicates lower page data.

First, write of lower page data is described with reference to FIG. 8. All memory cells are assumed to have the threshold voltage distribution E of the erase state, and to store data "11". As shown in FIG. 8, when write of lower page data is performed, the threshold voltage distribution E of the memory cell is divided into two threshold voltage distributions (E, B'), according to a value of the lower page data ("1" or "0"). That is, when the value of the lower page data is "1", the threshold voltage distribution E of the erase state is maintained.

On the other hand, when the value of the lower page data is "0", a high electrical field is applied to a tunnel oxide film of the memory cell, whereby electrons are injected into the floating gate electrode, causing a threshold voltage Vth of the memory cell to rise by a certain amount. Specifically, a verify potential VBV' is set, and the write operation is repeated until the threshold voltage Vth attains a threshold voltage of this verify voltage VBV' or more. As a result, the memory cell changes to a write state (data "10"). Note that the threshold voltage distribution B' of data "10" has a broader distribution than data "11" due to effects of the write operation on an adjacent cell.

Next, write of upper page data is described with reference to FIG. 9. Write of upper page data is performed on the basis of write data (upper page data) inputted from outside of the chip and the lower page data already written to the memory cell.

Figure 9:
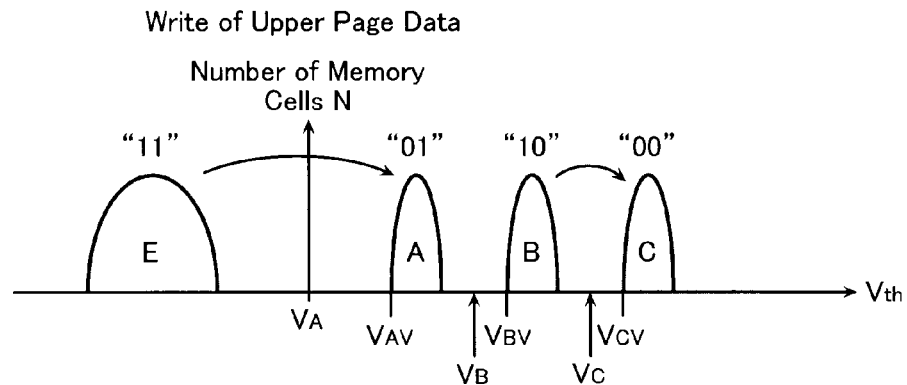
FIG. 9 shows an outline of a write operation (upper page write) in the case where two bits of information are stored in one memory cell.

That is, as shown in FIG. 9, when a value of the upper page data is "1", a high electrical field is prevented from being applied to the tunnel oxide film of the memory cell, thereby preventing a rise in the threshold voltage Vth of the memory cell. As a result, a memory cell of data "11" (threshold voltage distribution E of the erase state) is maintained as data "11", and a memory cell of data "10" (threshold voltage distribution B') is maintained as data "10". However, a regular verify voltage VBV larger than the above-mentioned verify voltage VBV' is utilized to adjust a lower limit value of the threshold voltage distribution, thereby allowing the threshold voltage distribution B having a narrowed width of threshold voltage distribution to be formed.

On the other hand, when the value of the upper page data is "0", a high electrical field is applied to the tunnel oxide film of the memory cell, whereby electrons are injected into the floating gate electrode, causing the threshold voltage Vth of the memory cell to rise by a certain amount. As a result, a memory cell of data "11" (threshold voltage distribution E of the erase state) changes to data "01" of the threshold voltage distribution A, and a memory cell of data "10" changes to data "00" of the threshold voltage distribution C. At this time, verify voltages VAV, VCV are employed to adjust lower limit values of the threshold voltage distributions A, C.

The above is one example of a general data write system in a four-level storage system. However, this is purely an example, and, regarding allocation of data to the threshold voltage distributions, procedure of the write operation and so on, various methods besides the above may be adopted. Moreover, even a multi-bit storage system of three bits or more merely further adds to the above-described operation an operation to divide the threshold voltage distribution eight-fold according to upper page data, and therefore has a basic operation that is similar to the above.

Figure 10:
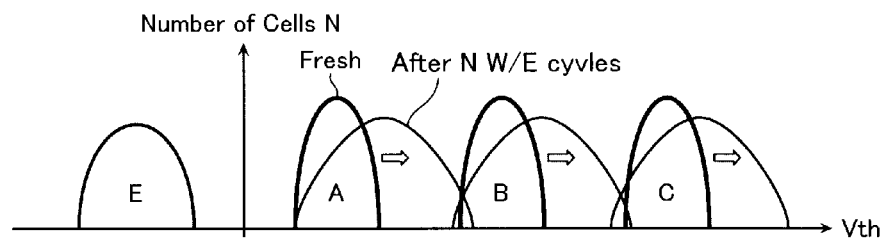
FIG. 10 is a problem of spreading of distribution width of the threshold voltage distribution.

By the way, when write/erase is repeatedly performed on one memory cell, an amount of charge trapped in regions other than the charge storage film, for example, in an element isolation insulating film, and so on, gradually increases. This kind of increase in trapped charge sometimes leads to a width of one threshold voltage distribution spreading, thereby creating trouble in read, and so on (refer to FIG. 10).

In order to release this kind of trapped charge and thereby suppress spreading of the threshold voltage distribution, when an erase operation is executed in the present embodiment, an operation to apply a certain stress voltage to the memory cells MC (pre-erase stress application operation) is executed prior to the erase operation. The controller 22 shown in FIG. 1 functions as a control circuit for controlling this pre-erase stress application operation. The pre-erase stress application operation is executed prior to execution of the erase operation (block unit) on the memory cells MC.

Figure 11A:
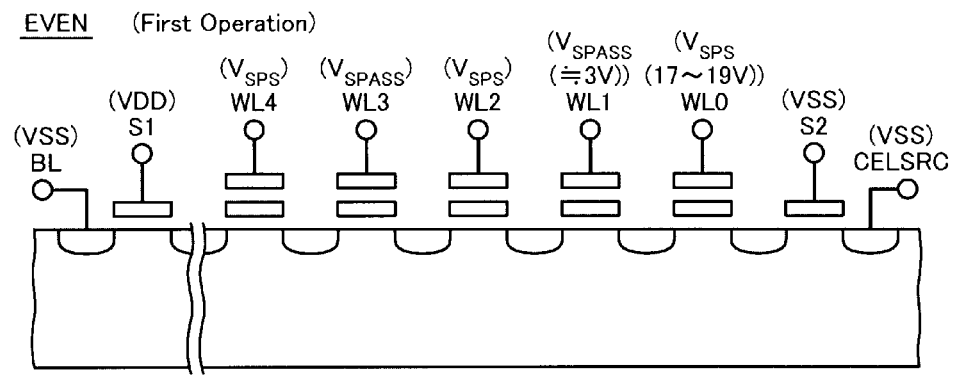
FIG. 11A shows one example of a pre-erase stress application operation in the nonvolatile semiconductor memory device of the first embodiment.
Figure 11A:
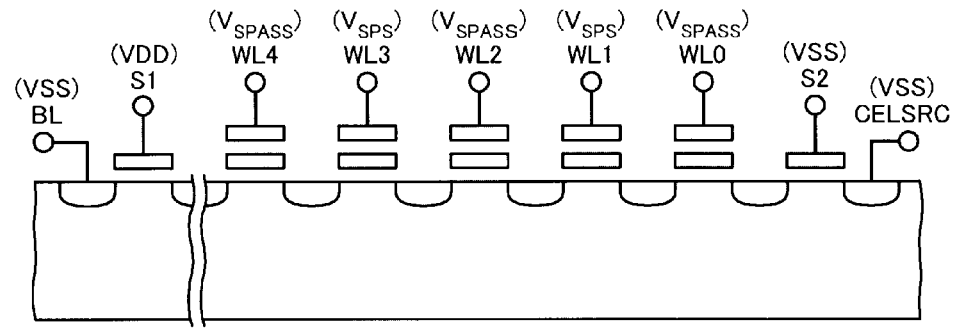

FIG. 11A shows voltages applied to one memory string in the pre-erase stress application operation. As shown in FIG. 11A, the pre-erase stress application operation can be executed by dividing the pre-erase stress application operation into a first operation and a second operation. The first operation is an operation in which the control gates of even-numbered memory cells MC (even-numbered word lines WL) in one memory string MS are applied with a voltage $V_{SPS}$ within a certain range (for example, about 17-19 V), while the control gates of odd-numbered memory cells MC (odd-numbered word lines WL) in the memory string MS are applied with a voltage $V_{SPASS}$ (for example, about 3 V) that is smaller than the voltage $V_{SPS}$. The second operation is an operation in which the odd-numbered memory cells MC in the memory string MS are applied with the voltage $V_{SPS}$, while the even-numbered memory cells MC in the memory string MS are applied with the voltage $V_{SPASS}$.

In both the first and second operations, the bit line BL is applied with a ground voltage $V_{SS}$ (0 V), while a gate of the drain side select gate transistor S1 is applied with a power supply voltage $V_{DD}$, thereby causing a channel to be charged to the ground voltage $V_{SS}$. As a result, a memory cell MC applied with the voltage $V_{SPS}$ has a stress applied to the memory cell due to a potential difference between the voltage $V_{SPS}$ (first voltage) and the ground voltage $V_{SS}$ (second voltage), whereby charge trapped in other than the floating gate FG is released. Note that the first and second operations may be executed in any order. In one pre-erase stress application operation, the first and second operations may each be performed multiple times.

Applying a different voltage ($V_{SPS}$, $V_{SPASS}$) to the control gate of the even-numbered and odd-numbered memory cells MC may enhance an electrical field applied to the element isolation insulating film where charge is easily trapped. As a result, unnecessary trapped charge can be efficiently released even by a relatively small voltage $V_{SPS}$. Employing a small voltage $V_{SPS}$ leads to data retention characteristics being maintained and improved, hence this method is effective for keeping data retention characteristics and suppressing spread in the threshold voltage distribution.

Figure 11B:
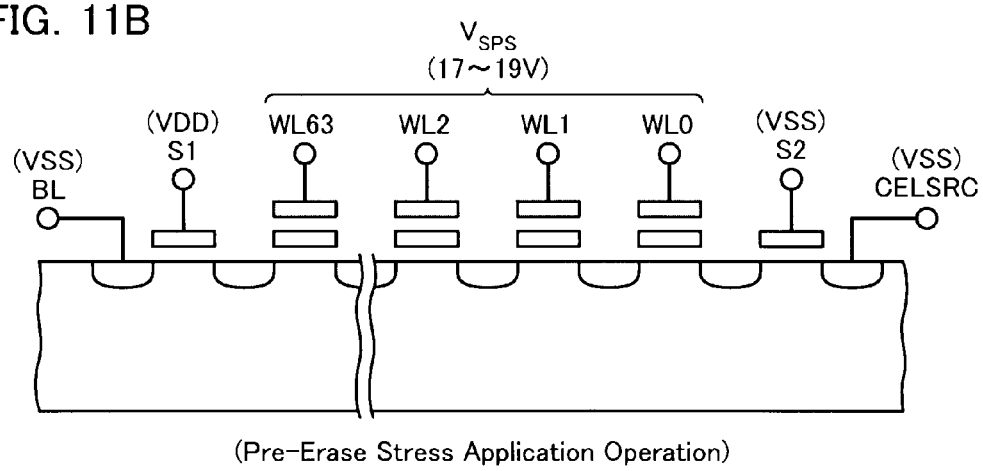
FIG. 11B shows one example of a pre-erase stress application operation in the nonvolatile semiconductor memory device of the first embodiment.

In addition, as shown in FIG. 11B, it is also possible to apply the voltage $V_{SPS}$ simultaneously to all word lines WL in the memory string MS. In the case of this method, the number of times of switching of voltages is small, hence this method is effective when a faster erase operation is required.

Figure 12:
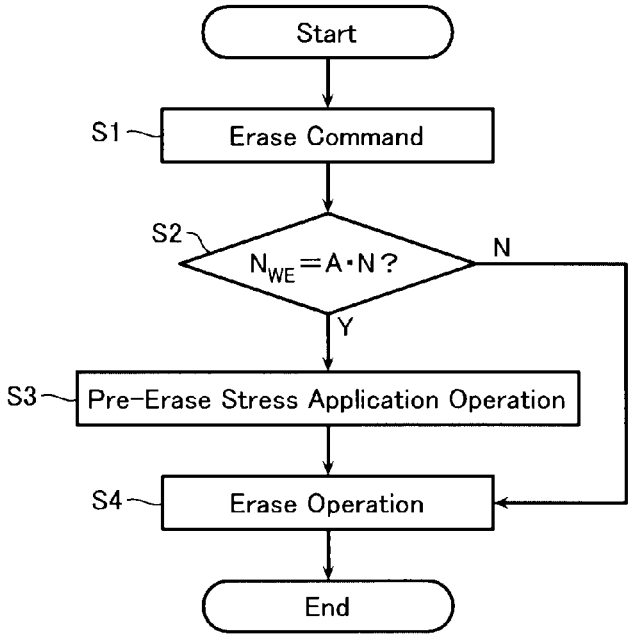
FIG. 12 is a flowchart showing a procedure of the pre-erase stress application operation in the nonvolatile semiconductor memory device of the first embodiment.

Furthermore, this pre-erase stress application operation need not be executed each time one erase operation is performed, and, as shown in the flowchart of FIG. 12, may be performed once every multiple times (N times, for example, N=1000) that the write operation and erase operation are performed. That is, as shown in FIG. 12, when an ERASE command instructing execution of the erase operation is issued (S1), the controller 22 refers to the number of times of executions $N_{WE}$ of the write operation/erase operation counted by the counter 28. Then, only when that count number $N_{WE}$ is equal to A times N (A·N, A are integers of 1 or more) the pre-erase stress application operation is executed (Y in S2, S3). In other cases, the erase operation is performed without executing the pre-erase stress application operation (S4). Note that the pre-erase stress application operation need not be performed periodically every fixed N number of times as described above, and is, for example, preferably executed more frequently as the write/erase operations increase (for example, every 1000 times up to $N_{WE}$=10000, and every 500 times when $N_{WE}$>10000).

Figure 13:
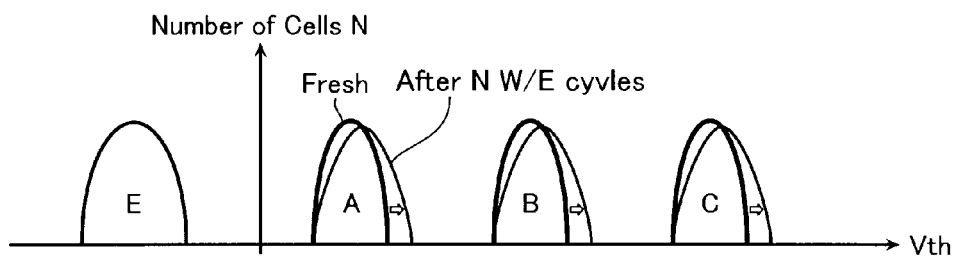
FIG. 13 shows advantages of the first embodiment.

As shown in FIG. 13, executing this kind of pre-erase stress application operation enables spreading of distribution width of the threshold voltage distribution to be suppressed even after the write operation/erase operation have been repeated multiple times.

Second Embodiment

Figure 14:
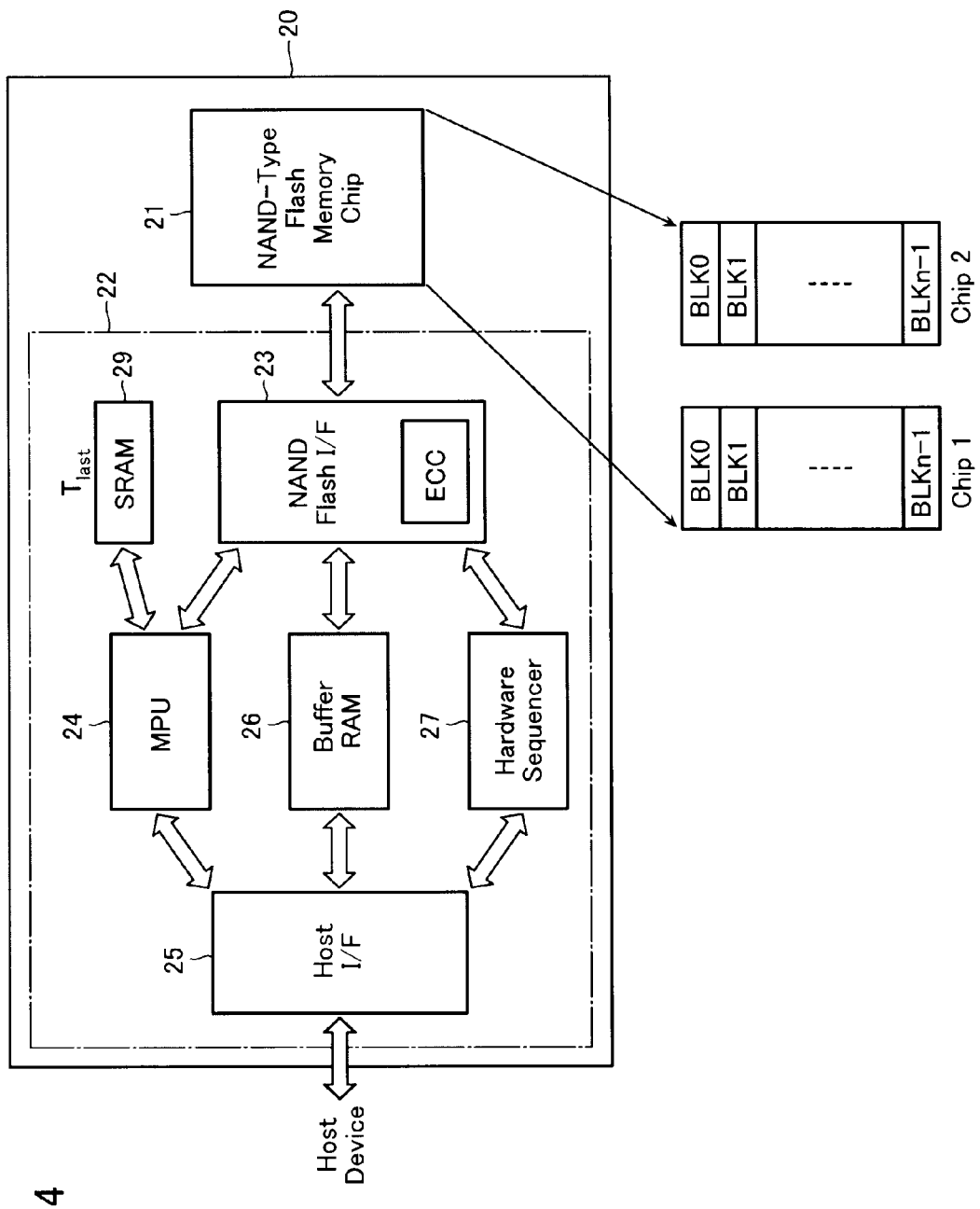
FIG. 14 is a block diagram showing an overall configuration of a memory card 20 which is a nonvolatile semiconductor memory device according to a second embodiment.

Next, a semiconductor memory device according to a second embodiment of the present invention is described with reference to FIG. 14 and so on. FIG. 14 is a block diagram showing an overall configuration of a memory card 20 which is a nonvolatile semiconductor memory device according to the second embodiment. In FIG. 14, configurative elements identical to those in the first embodiment are assigned with identical reference symbols to those used in the first embodiment, and a detailed description of such configurative elements is omitted from the description below.

In this second embodiment, the pre-erase stress application operation is executed whenever a certain time elapses, instead of every certain number of times. Therefore, the nonvolatile semiconductor memory device in the second embodiment comprises an SRAM 29 for storing a time (last execution time) $T_{last}$ of a most recently executed pre-erase stress application operation, in place of the counter 28.

Figure 15:
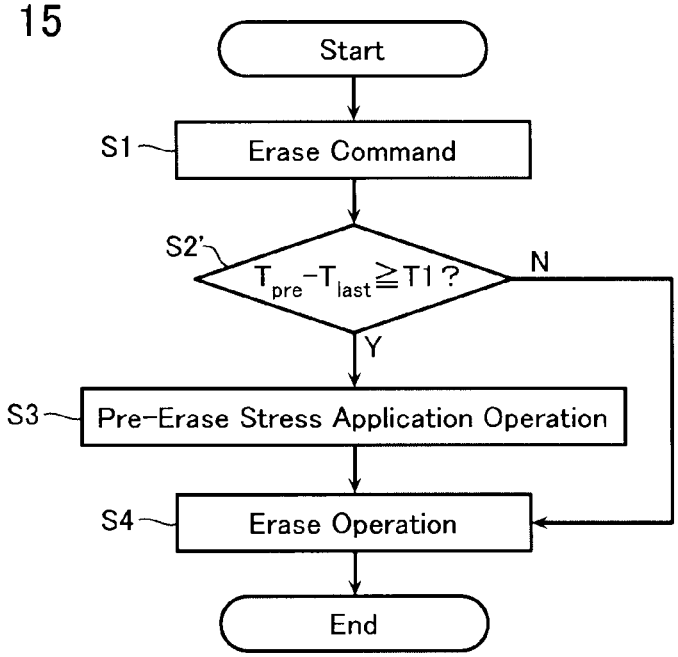
FIG. 15 is a flowchart showing a procedure of a pre-erase stress application operation in the nonvolatile semiconductor memory device of the second embodiment.

In addition, information of a present time $T_{pre}$ is received from, for example, a host device (not shown). As shown in FIG. 15, this present time $T_{pre}$ and last execution time $T_{last}$ are compared, and, if a difference $T_{pre}$-$T_{last}$ is a certain value T1 or more, the pre-erase stress application operation is executed (Y in S2'). In other cases, only the erase operation is executed, without the pre-erase stress application operation being executed.

Note that the nonvolatile semiconductor memory device in the second embodiment may comprise both the counter 28 and the SRAM 29 and be configured to determine whether the pre-erase stress application operation is to be executed or not based on both the counter value $N_{WE}$ and last execution time $T_{last}$.

Moreover, in this second embodiment, either of the pre-erase stress application operation of FIG. 11A and the erase pulse application operation of FIG. 11B may be executed.

Third Embodiment

Next, a semiconductor memory device according to a third embodiment of the present invention is described with reference to FIG. 16A and so on. An overall configuration of the nonvolatile semiconductor memory device may be identical to that shown in FIG. 1.

The present embodiment is characterized in that the voltage $V_{SPS}$ employed in the pre-erase stress application operation is set to a large value as the number of times of executions $N_{WE}$ of the write operation/erase operation increases. That is, as shown in FIG. 16A, when the number of times of executions $N_{WE}$ is less than N1, the voltage $V_{SPS}$ is set to a smallest value $V_{SPS1}$(Y in S12, S13). When the number of times of executions $N_{WE}$ is N1 or more but less than N2, the voltage $V_{SPS}$ is set to a value $V_{SPS2}$ larger than the voltage $V_{SPS1}$ (N in S14, S15). When the number of times of executions $N_{WE}$ is N2 or more, the voltage $V_{SPS}$ is set to a value $V_{SPS3}$ larger than the voltage $V_{SPS2}$ (Y in S14, S16)

Figure 16A:
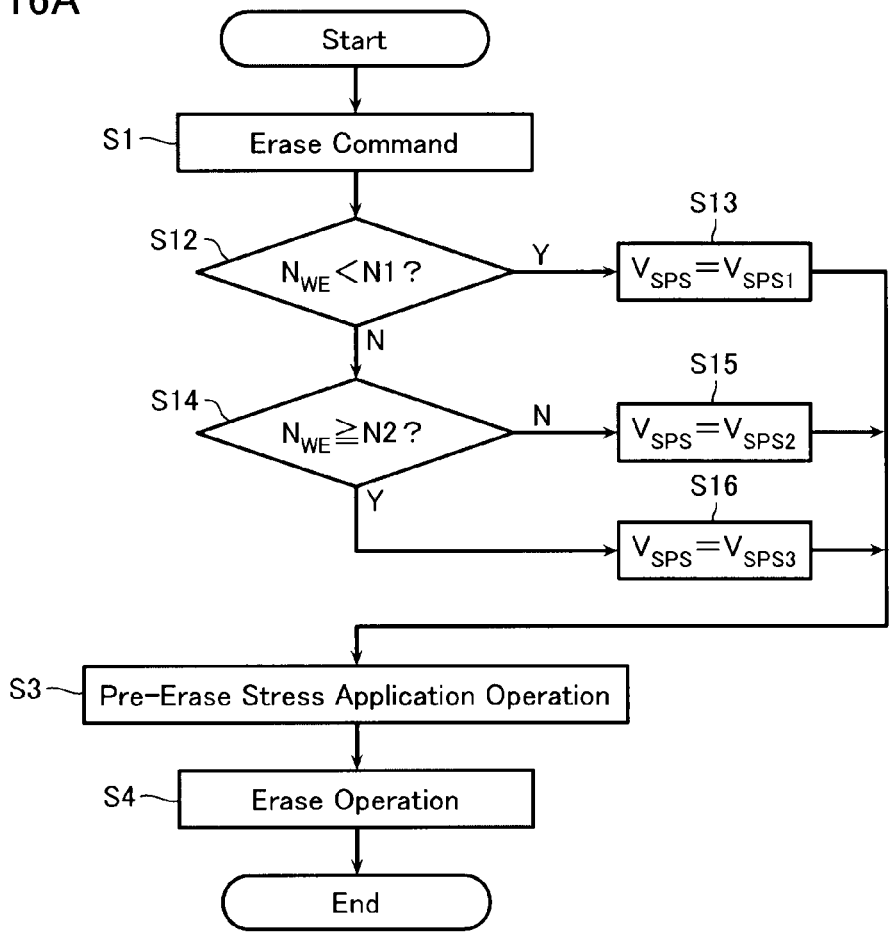
FIG. 16A is a flowchart showing a procedure of a pre-erase stress application operation in a nonvolatile semiconductor memory device of a third embodiment.

Note that the operation shown in FIG. 16A shows an operational procedure where the pre-erase stress application operation is executed whenever an Erase command is issued. However, a configuration may be adopted in which the pre-erase stress application operation is executed every certain number of times N as shown in FIG. 12. Then, a value of the voltage $V_{SPS}$ may be changed according to a magnitude of the count value $N_{WE}$ at that time. Specifically, an operation having steps S12-S16 inserted between steps S2 and S3 of FIG. 12 may be executed.

Figure 16B:
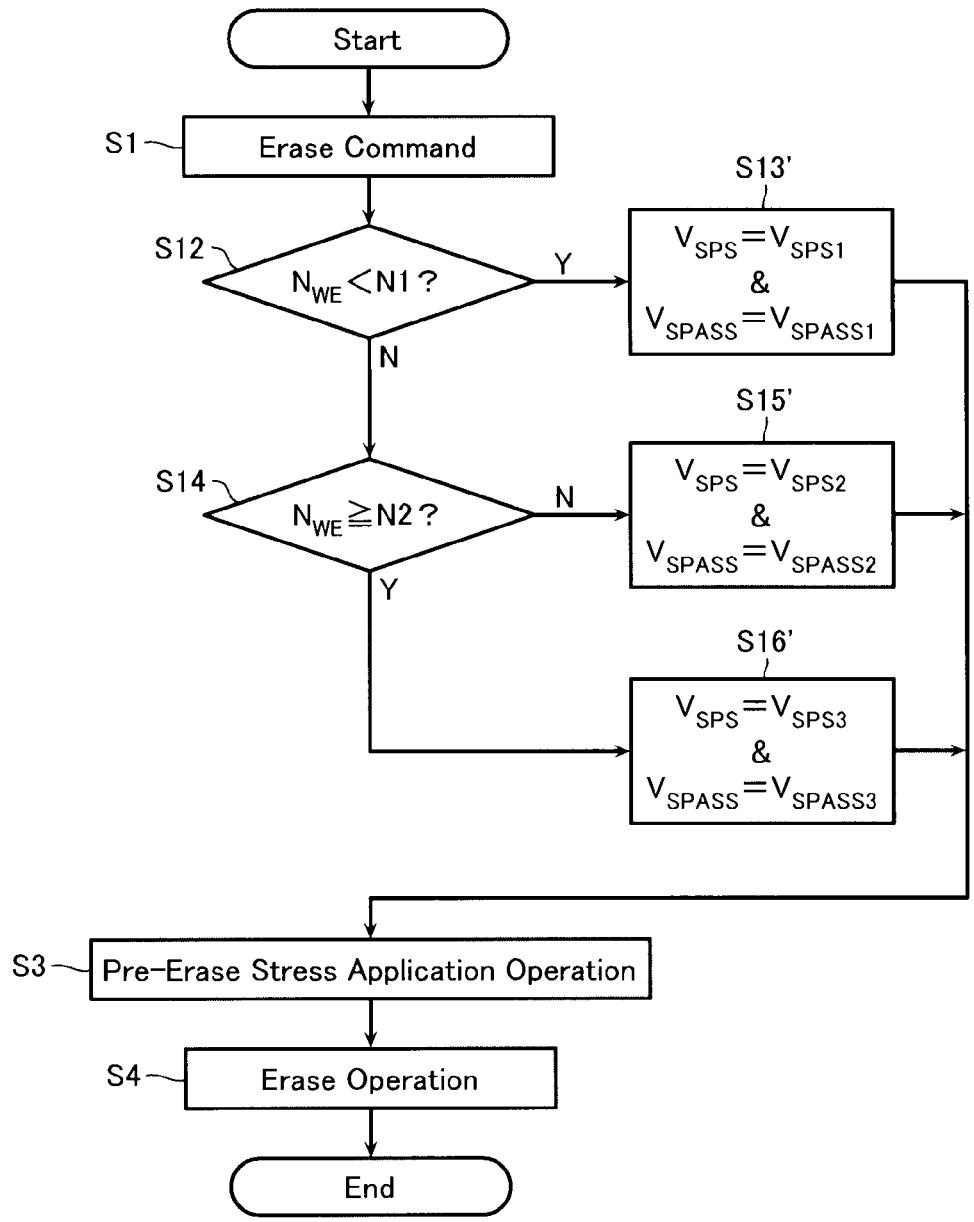
FIG. 16B is a flowchart showing a modified example of the procedure of the pre-erase stress application operation in the nonvolatile semiconductor memory device of the third embodiment.

Note that, as shown in FIG. 16B, it is also possible to change a value of the voltage $V_{SPASS}$ to different values $V_{SPASS1}$, $V_{SPASS2}$, $V_{SPASS3}$ ($V_{SPASS1}$<$V_{SPASS2}$<$V_{SPASS3}$), along with changing the voltage $V_{SPS}$ (S13', S15', S16'). Moreover, in this third embodiment, either of the pre-erase stress application operation of FIG. 11A and the erase pulse application operation of FIG. 11B may be executed. The configuration of an operation having steps S12-S16 inserted between steps S2 and S3 of FIG. 12 may be adopted in this case too.

Fourth Embodiment

A semiconductor memory device according to a fourth embodiment of the present invention is described with reference to FIG. 17A and so on. An overall configuration of the nonvolatile semiconductor memory device may be identical to that shown in FIG. 1.

Figure 17A:
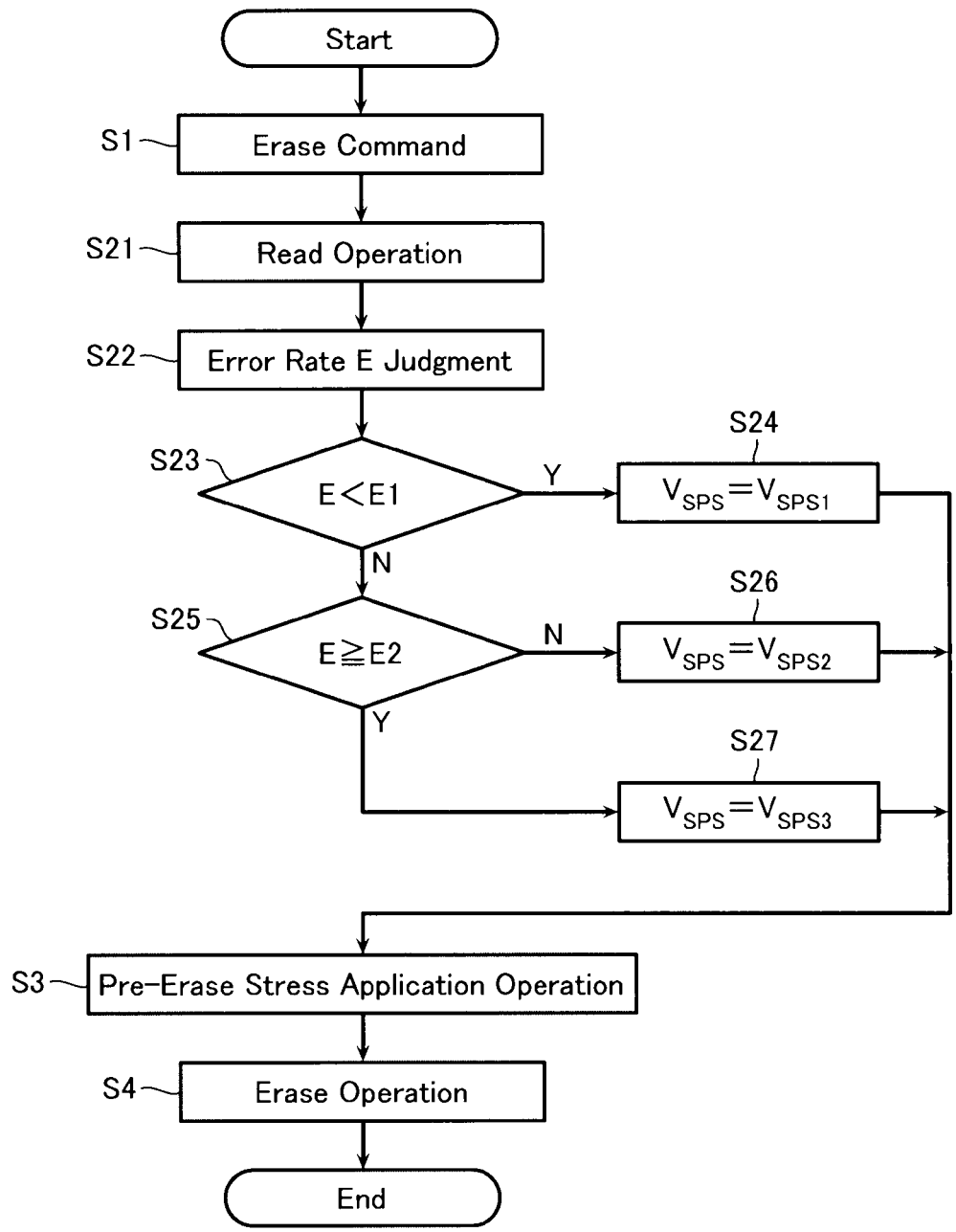
FIG. 17A is a flowchart showing a procedure of a pre-erase stress application operation in a nonvolatile semiconductor memory device of a fourth embodiment.

In this embodiment, as shown in FIG. 17A, when the Erase command is issued (S1), a read operation is executed on the memory cell MC (S21). The controller 22 judges an error rate (error occurrence rate) E of read data based on parity data (S22). Then, the controller 22 changes a value of the voltage $V_{SPS}$ applied in the pre-erase stress application operation into three kinds, for example, $V_{SPS1}$, $V_{SPS2}$, $V_{SPS3}$, based on the level of the error rate E ($V_{SPS1}$<$V_{SPS2}$<$V_{SPS3}$). In FIG. 17A, the voltage $V_{SPS}$ is made different among the cases where the error rate E is less than E1, where the error rate E is E1 or more but less than E2, and where the error rate E is E2 or more (S23-S27).

Note that the operation shown in FIG. 17A shows an operational procedure where the pre-erase stress application operation is executed whenever an Erase command is issued. However, a configuration may be adopted in which the pre-erase stress application operation is executed every certain number of times N as shown in FIG. 12, and a value of the voltage $V_{SPS}$ is changed according to high-low of the error rate E at those times of execution of the pre-erase stress application operation. That is, an operational procedure incorporating the flowchart of FIG. 17A into the flowchart of FIG. 12 may also be executed.

Figure 17B:
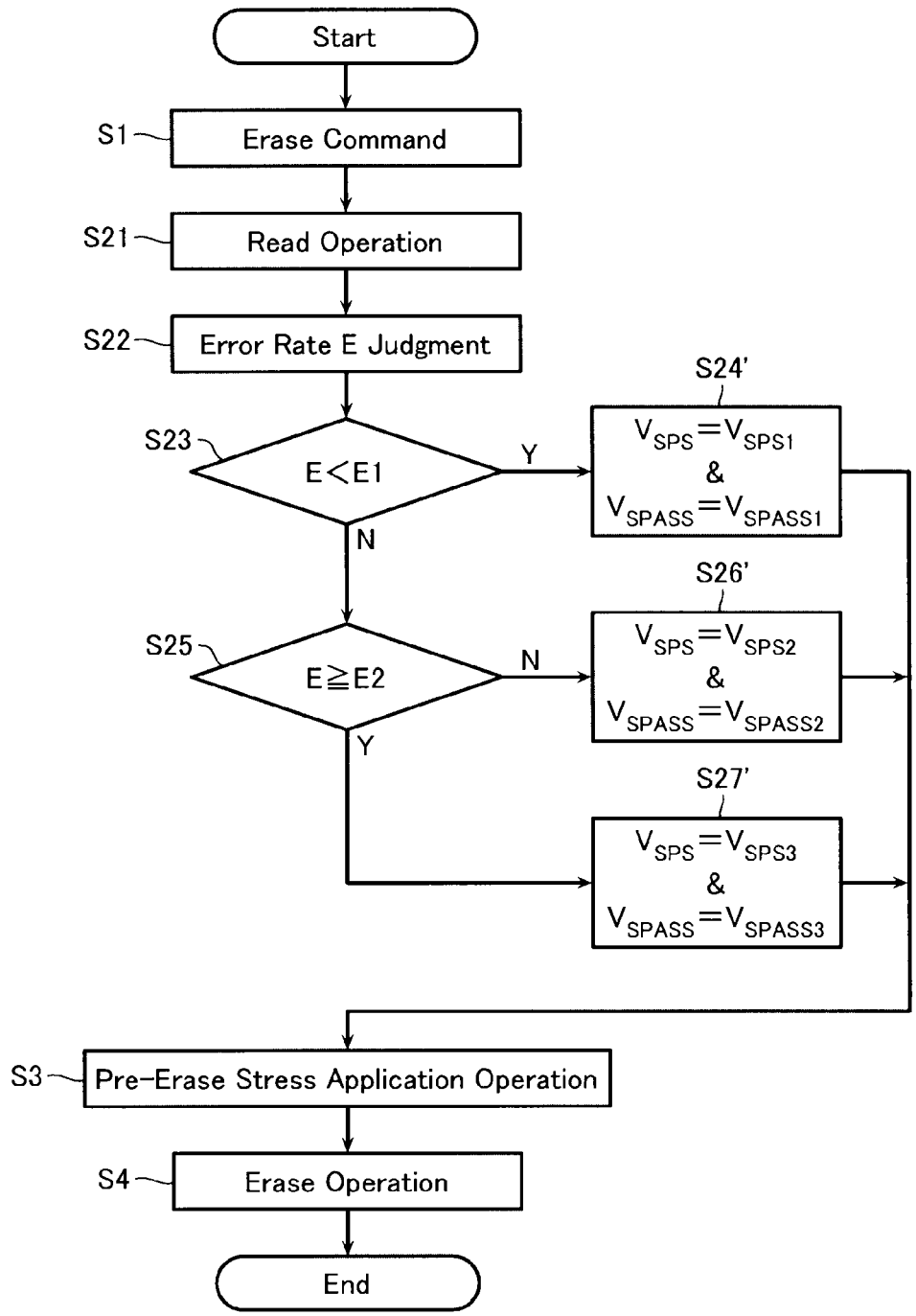
FIG. 17B is a flowchart showing a modified example of the procedure of the pre-erase stress application operation in the nonvolatile semiconductor memory device of the fourth embodiment.

In addition, as shown in FIG. 17B, it is also possible to change a value of the voltage $V_{SPASS}$ to different values $V_{SPASS1}$, $V_{SPASS2}$, $V_{SPASS3}$ ($V_{SPASS1}$<$V_{SPASS2}$<$V_{SPASS3}$), along with changing the voltage $V_{SPS}$. Moreover, in this fourth embodiment, either of the pre-erase stress application operation of FIG. 11A and the erase pulse application operation of FIG. 11B may be executed. Note that in the above-described example, the error rate E is calculated. However, it is only required to calculate a degree of error occurrence in the read operation, and various other indices besides the error rate E may be calculated, provided these indices represent degree of error occurrence.

Fifth Embodiment

Next, a semiconductor memory device according to a fifth embodiment of the present invention is described with reference to FIG. 18A and so on. An overall configuration of the nonvolatile semiconductor memory device may be identical to that shown in FIG. 1.

This embodiment shares similarity with the fourth embodiment in that magnitude of the voltage $V_{SPS}$ is changed based on high-low of the error rate E. In FIG. 18A, steps identical to those in FIG. 17A are assigned with identical symbols to those used in FIG. 17A, and a detailed description of such steps is here omitted.

However, in the present embodiment, the read operation for judging the error rate E is executed and the error rate E is saved in advance in a standby state of waiting for the various operations on the memory cells (S21, S22). Further, when the Erase command is received, an identical procedure to that in the fourth embodiment is executed based on the stored error rate E. This operation allows time of the erase operation to be reduced compared to in the fourth embodiment, since there is no need to perform a read operation and error rate E judgment operation whenever there is an Erase command instructing the erase operation.

Figure 18A:
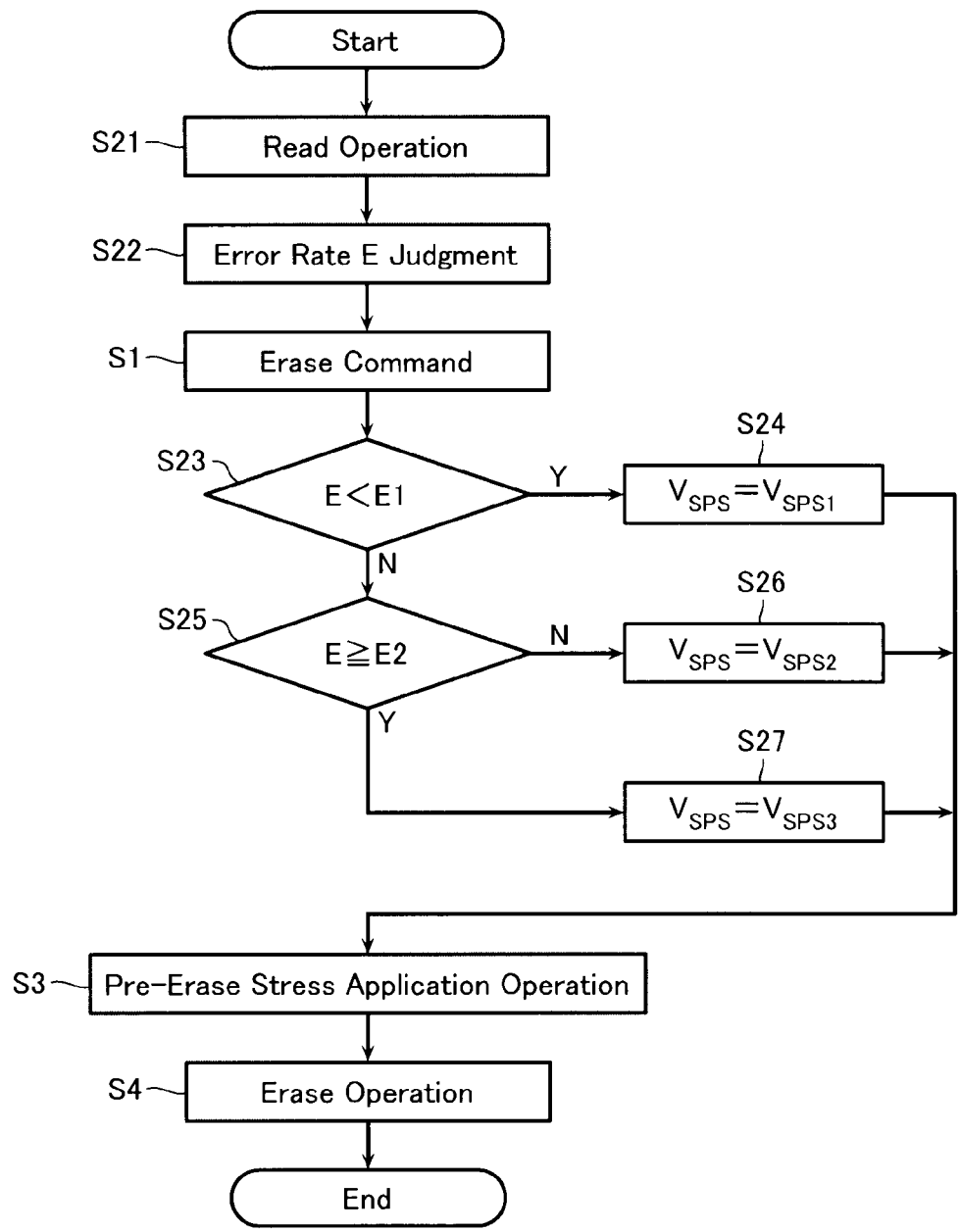
FIG. 18A is a flowchart showing a procedure of a pre-erase stress application operation in a nonvolatile semiconductor memory device of a fifth embodiment.

Note that the operation shown in FIG. 18A shows an operational procedure where the pre-erase stress application operation is executed whenever an Erase command is issued. However, a configuration may be adopted in which the pre-erase stress application operation is executed every certain number of times N as shown in FIG. 12, and a value of the voltage $V_{SPS}$ is changed according to high-low of the error rate E at those times of execution of the pre-erase stress application operation. That is, an operational procedure incorporating the flowchart of FIG. 18A into the flowchart of FIG. 12 may also be executed.

Figure 18B:
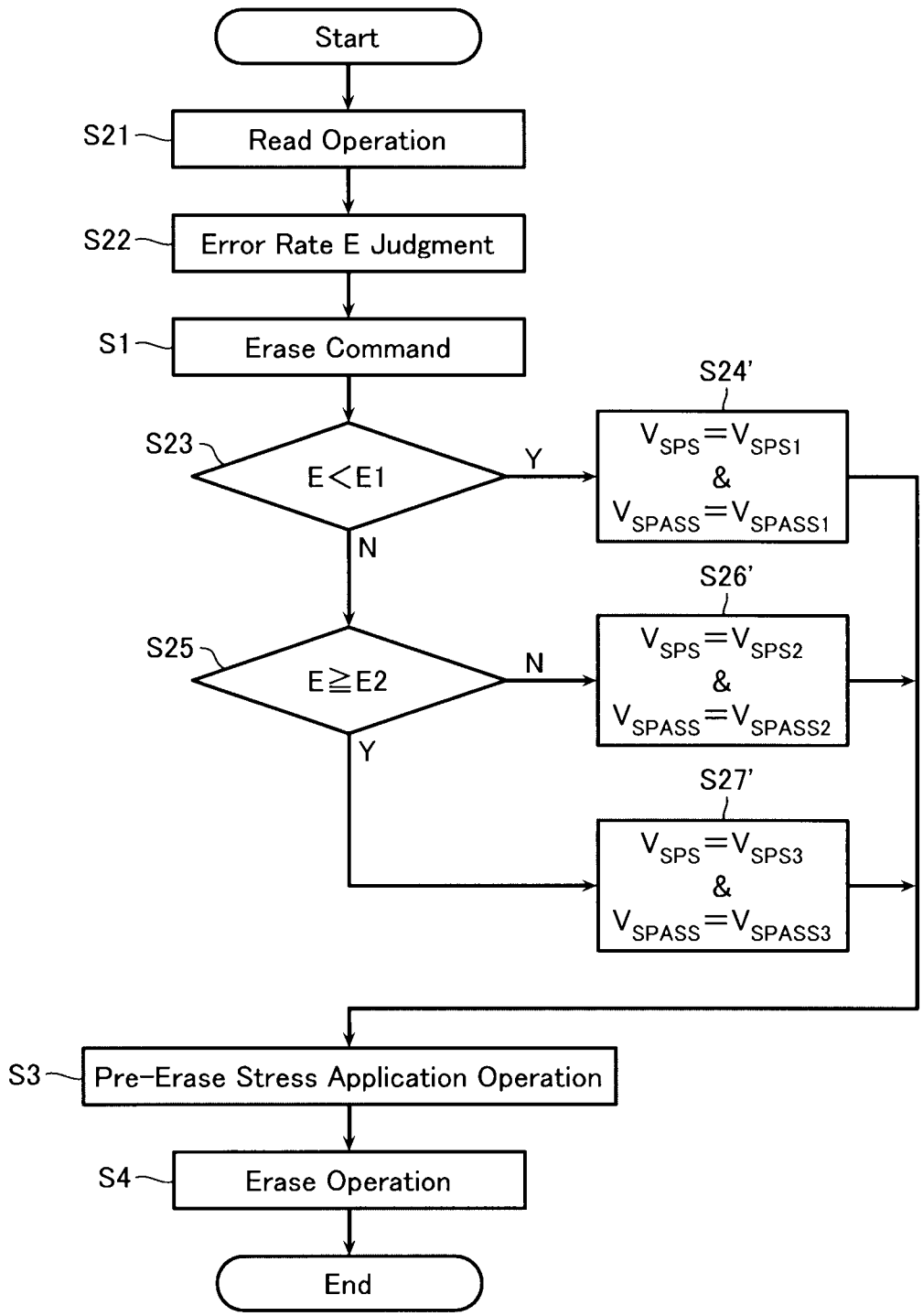
FIG. 18B is a flowchart showing a modified example of the procedure of the pre-erase stress application operation in the nonvolatile semiconductor memory device of the fifth embodiment.

In addition, as shown in FIG. 18B, it is also possible to change a value of the voltage $V_{SPASS}$ to different values $V_{SPASS1}$, $V_{SPASS2}$, $V_{SPASS3}$ ($V_{SPASS1} < V_{SPASS2} < V_{SPASS3}$), along with changing the voltage $V_{SPS}$. Moreover, in this fifth embodiment, either of the pre-erase stress application operation of FIG. 11A and the erase pulse application operation of FIG. 11B may be executed.

Sixth Embodiment

Next, a semiconductor memory device according to a sixth embodiment of the present invention is described with reference to FIG. 19. An overall configuration of the nonvolatile semiconductor memory device may be identical to that shown in FIG. 1.

In this embodiment, similarly to in FIG. 11A in the first embodiment, the pre-erase stress application operation is executed by dividing the pre-erase stress application operation into a first operation and a second operation, the first operation being an operation in which the control gates of even-numbered memory cells MC in one memory string MS are applied with a certain stress voltage, while the control gates of odd-numbered memory cells MC in the memory string MS are applied with a voltage smaller than this stress voltage, and the second operation being an operation in which the odd-numbered memory cells MC in the memory string MS are applied with a certain stress voltage, while the even-numbered memory cells MC in the memory string MS are applied with a voltage smaller than this stress voltage.

Figure 19:
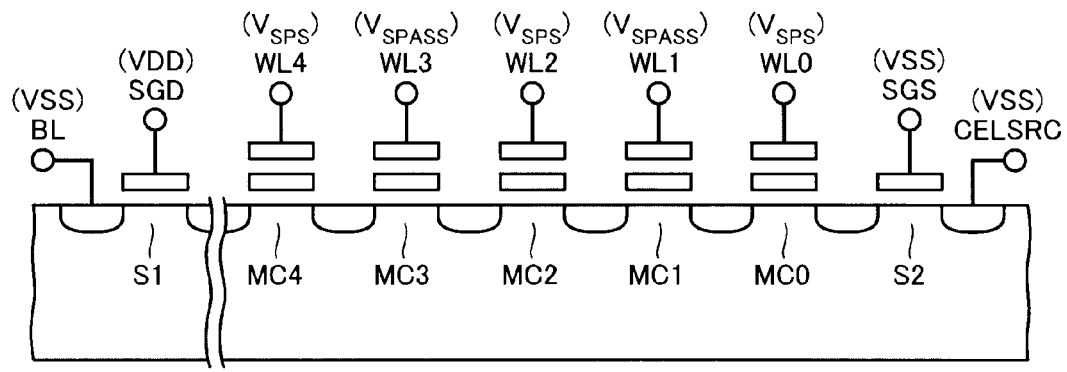
FIG. 19 is a schematic view showing a pre-erase stress application operation in a nonvolatile semiconductor memory device of a sixth embodiment.
Figure 19:
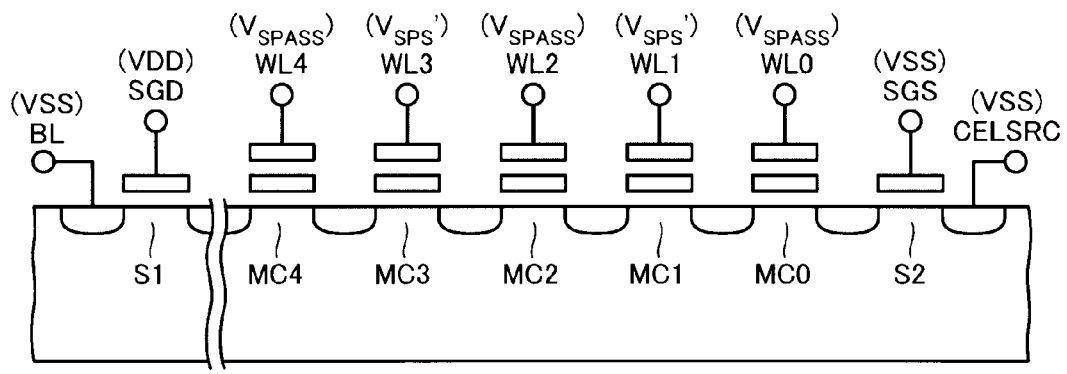

However, in this embodiment, as shown in FIG. 19, a stress voltage $V_{SPS}$ applied in the first operation and a stress voltage $V_{SPS}'$ applied in the second operation have different values ($V_{SPS} \neq V_{SPS}'$). The reason is as follows.

Miniaturization is required in NAND-type flash memory, similarly to in other semiconductor devices. However, it has become difficult to achieve required levels of wiring width and wiring pitch by conventional lithography techniques. Accordingly, the so-called sidewall transfer process is sometimes employed as a manufacturing technique of NAND-type flash memory. In the sidewall transfer process, a hard mask of a line-and-space pattern formed by a lithography technique is formed, and a sidewall film is formed on a sidewall of that hard mask. Subsequently, anisotropic etching is executed to etch the hard mask of the line-and-space pattern, leaving only the sidewall film. Then, this sidewall film is used as a mask to etch a film material. This allows a line-and-space pattern exceeding a resolution limit of a stepper to be formed. Details of the sidewall transfer process are described in, for example, JP 2008-27991 A.

Figure 20:
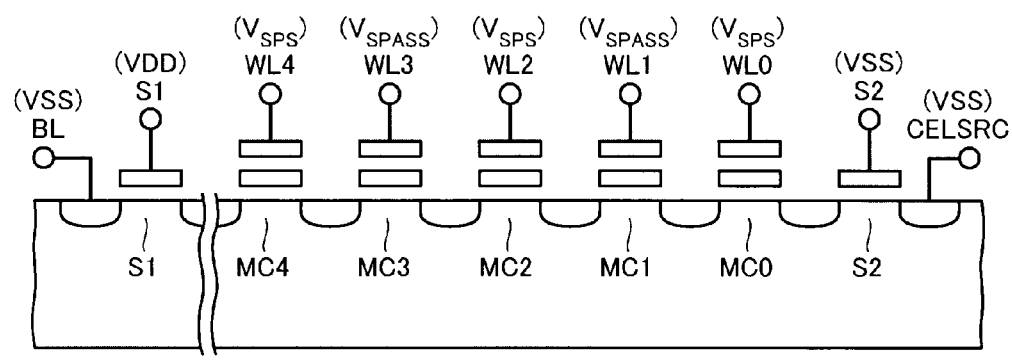
FIG. 20 is a schematic view showing a separate example of a pre-erase stress application operation in a nonvolatile semiconductor memory device according to the sixth embodiment.
Figure 20:
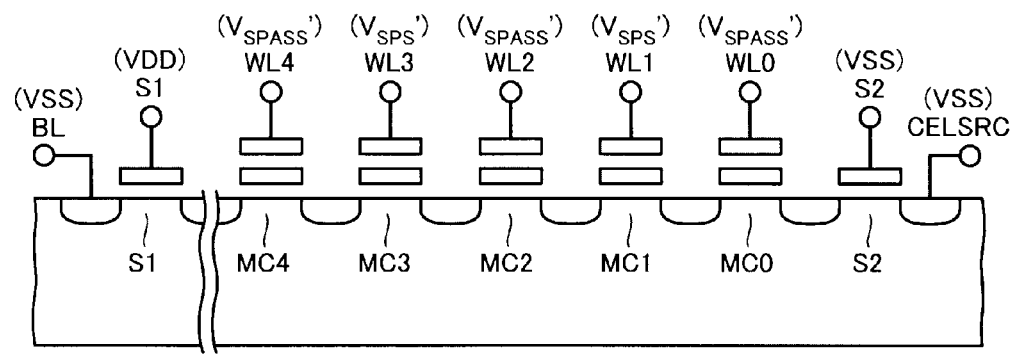

However, a line-and-space pattern obtained by this kind of sidewall transfer process may have a wiring width that differs between even-numbered wirings and odd-numbered wirings. Therefore, in the pre-erase stress application operation in the present embodiment, the stress voltage applied to even-numbered memory cells and the stress voltage applied to odd-numbered memory cells are made different. As a result, a difference in effect of the pre-erase stress application operation in all the word lines WL can be prevented from occurring. Note that, as shown in FIG. 20, a voltage $V_{SPASS}$ applied during the first operation and a voltage $V_{SPASS}'$ applied during the second operation may also have different values.

[Other]

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions, and changes in the form of the methods and systems described herein may be made without departing from the spirit of the inventions. The accompanying claims and their equivalents are intended to cover such forms or modifications as would fall within the scope and spirit of the inventions. For example, in the above-described embodiments, an example of a system storing two or more bits of data in one memory cell is described. However, the present invention is not limited to this example, and may also be applied to a device storing one bit in one memory cell, and, moreover, may also be applied to a device storing multiple bits of three or more bits in one memory cell.

What is claimed is:

1. A nonvolatile semiconductor memory device, comprising:
   a memory cell array including a plurality of memory strings arranged therein, each of the memory strings including memory cells connected in series, each of the memory cells comprising a charge storage film formed on a channel region via a gate insulating film, and a control gate formed on the charge storage film via an insulating film; and
   a control circuit configured to enable execution of a pre-erase stress application operation prior to an erase operation on the memory cells, the pre-erase stress application operation applies a first voltage within a certain voltage range to the control gate, while applying a second voltage having a value smaller than a value of the first voltage to the channel region,
   wherein the control circuit is configured to execute a first operation and a second operation as the pre-erase stress application operation is executed,
   the first operation applies the first voltage to even-numbered memory cells in the memory string, while applying a third voltage having a value smaller than a value of the first voltage to odd-numbered memory cells in the memory string, and
   the second operation applies the first voltage to the odd-numbered memory cells in the memory cell string, while applying the third voltage to the even-numbered memory cells in the memory cell string.

2. The nonvolatile semiconductor memory device according to claim 1, wherein
   a value of the first voltage in the first operation and a value of the first voltage in the second operation differ from each other.

3. The nonvolatile semiconductor memory device according to claim 2, wherein
   a value of the third voltage in the first operation and a value of the third voltage in the second operation differ from each other.

4. The nonvolatile semiconductor memory device according to claim 1, wherein
   the control circuit is configured to change a value of the first voltage or the third voltage according to a degree of error occurrence in read data obtained by a read operation on the memory cells.

5. The nonvolatile semiconductor memory device according to claim 4, wherein
   the control circuit is configured to, when a command for execution of the erase operation is issued, execute the read operation prior to the pre-erase stress application operation, and change a value of the first voltage or the third voltage according to a degree of error occurrence in read data obtained by the read operation.

6. The nonvolatile semiconductor memory device according to claim 1, wherein
the control circuit is configured to execute the pre-erase stress application operation whenever the number of times of write/erase indicating the total number of times of a write operation and an erase operation performed on the memory cell array reaches a certain number of times.

7. The nonvolatile semiconductor memory device according to claim 6, wherein
the control circuit further comprises a counter configured to count the number of times of write/erase.

8. The nonvolatile semiconductor memory device according to claim 6, wherein
the control circuit is configured to execute the pre-erase stress application operation when the number of times of write/erase has reached a multiple of an integer N.

9. The nonvolatile semiconductor memory device according to claim 6, wherein
the control circuit is configured to change a value of the first voltage in the pre-erase stress application operation according to the number of times of write/erase.

10. A nonvolatile semiconductor memory device, comprising:
a memory cell array including a plurality of memory strings arranged therein, each of the memory strings including memory cells connected in series, each of the memory cells comprising a charge storage film formed on a channel region via a gate insulating film, and a control gate formed on the charge storage film via an insulating film; and
a control circuit configured to enable execution of a pre-erase stress application operation prior to an erase operation on the memory cells, the pre-erase stress application operation applies a first voltage within a certain voltage range to the control gate, while applying a second voltage having a value smaller than a value of the first voltage to the channel region, wherein
the control circuit is configured to execute the pre-erase stress application operation whenever a certain time elapses,
the control circuit comprises a memory unit for storing a time of the pre-erase stress application operation most recently executed, and
the control circuit compares a present time and the time stored in the memory unit and, in the case that a difference between the present time and the time stored in the memory unit is a certain value or more, executes the pre-erase stress application operation.

11. The nonvolatile semiconductor memory device according to claim 4, wherein
the control circuit is configured to execute the read operation in a standby state of waiting for an instruction of various kinds of operations on the memory cell array.

12. A method of controlling a nonvolatile semiconductor memory device, the nonvolatile semiconductor memory device comprising a memory cell array including a plurality of memory strings arranged therein, each of the memory strings including memory cells connected in series, each of the memory cells comprising a charge storage film formed on a channel region via a gate insulating film and a control gate formed on the charge storage film via an insulating film, the method comprising:
executing a pre-erase stress application operation on the memory cells, the pre-erase stress application operation applies a first voltage to the control gate, while applying a second voltage having a value smaller than a value of the first voltage to the channel region; and
executing an erase operation on the memory cells subsequent to the pre-erase stress application operation,
wherein the pre-erase stress application operation executes a first operation and a second operation,
the first operation applies the first voltage to even-numbered memory cells in the memory string, while applying a third voltage having a value smaller than a value of the first voltage to odd-numbered memory cells in the memory string, and
the second operation applies the first voltage to the odd-numbered memory cells in the memory cell string, while applying the third voltage to the even-numbered memory cells in the memory cell string.

13. The method of controlling a nonvolatile semiconductor memory device according to claim 12, wherein
a read operation on the memory cells is executed prior to the pre-erase stress application operation, and
the pre-erase stress application operation is configured to change a value of the first voltage or the third voltage according to a degree of error occurrence in read data obtained by the read operation.

14. The nonvolatile semiconductor memory device according to claim 10, wherein
the control circuit is configured to execute a first operation and a second operation when the pre-erase stress application operation is executed,
the first operation applies the first voltage to even-numbered memory cells in the memory string, while applying a third voltage having a value smaller than a value of the first voltage to odd-numbered memory cells in the memory string, and
the second operation applies the first voltage to the odd-numbered memory cells in the memory cell string, while applying the third voltage to the even-numbered memory cells in the memory cell string.

15. The nonvolatile semiconductor memory device according to claim 14, wherein
a value of the first voltage in the first operation and a value of the first voltage in the second operation differ from each other.

16. The nonvolatile semiconductor memory device according to claim 14, wherein
a value of the third voltage in the first operation and a value of the third voltage in the second operation differ from each other.

17. The nonvolatile semiconductor memory device according to claim 14, wherein
the control circuit is configured to change a value of the first voltage or the third voltage according to a degree of error occurrence in read data obtained by a read operation on the memory cells.

* * * * *